United States Patent
Stephens et al.

(10) Patent No.: US 7,910,482 B2
(45) Date of Patent: Mar. 22, 2011

(54) METHOD OF FORMING A FINFET AND STRUCTURE

(75) Inventors: Tab A. Stephens, Buda, TX (US); Leo Mathew, Austin, TX (US); Lakshmanna Vishnubholta, Austin, TX (US); Bruce E. White, Binghamton, NY (US)

(73) Assignee: Freescale Semiconductor, Inc., Austin, TX (US)

( * ) Notice: Subject to any disclaimer, the term of this patent is extended or adjusted under 35 U.S.C. 154(b) by 60 days.

(21) Appl. No.: 12/130,158

(22) Filed: May 30, 2008

(65) Prior Publication Data

US 2009/0294919 A1 Dec. 3, 2009

(51) Int. Cl.
*H01L 21/302* (2006.01)

(52) U.S. Cl. ........ 438/689; 438/698; 438/149; 438/192; 438/196; 438/212; 257/E21.537

(58) Field of Classification Search .................. 438/197, 438/192, 212, 149, 689, 698
See application file for complete search history.

(56) References Cited

U.S. PATENT DOCUMENTS

| | | | |
|---|---|---|---|
| 6,583,469 B1 | 6/2003 | Fried et al. | |
| 6,716,685 B2 * | 4/2004 | Lahaug | 438/157 |
| 6,740,549 B1 * | 5/2004 | Chen et al. | 438/197 |
| 6,812,075 B2 | 11/2004 | Fried et al. | |
| 6,835,609 B1 | 12/2004 | Lee et al. | |
| 6,844,238 B2 | 1/2005 | Yeo et al. | |
| 6,962,843 B2 * | 11/2005 | Anderson et al. | 438/212 |
| 7,323,373 B2 | 1/2008 | Mathew et al. | |
| 2005/0026429 A1 | 2/2005 | Liaw | |
| 2006/0043502 A1 * | 3/2006 | Natzle et al. | 257/401 |
| 2006/0138552 A1 * | 6/2006 | Brask et al. | 257/369 |
| 2007/0172996 A1 * | 7/2007 | Mathew et al. | 438/142 |
| 2008/0171407 A1 * | 7/2008 | Nakabayashi et al. | 438/151 |

* cited by examiner

*Primary Examiner* — Davienne Monbleau
*Assistant Examiner* — Farid Khan
(74) *Attorney, Agent, or Firm* — James L. Clingan, Jr.

(57) ABSTRACT

A method for processing a substrate comprising at least a buried oxide (BOX) layer and a semiconductor material layer is provided. The method includes etching the semiconductor material layer to form a vertical semiconductor material structure overlying the BOX layer, leaving an exposed portion of the BOX layer. The method further includes exposing a top surface of the exposed portion of the BOX layer to an oxide etch resistant species to form a thin oxide etch resistant layer overlying the exposed portion of the BOX layer.

20 Claims, 7 Drawing Sheets

METHOD OF FORMING A FINFET AND STRUCTURE

BACKGROUND

1. Field

This disclosure relates generally to semiconductors, and more specifically, to transistors made using a fin.

2. Related Art

The use of semiconductor fins has been found to be very useful in making transistors that, for a given area, have more drive and less leakage. The making of fins, however, present a number of challenges. In practice there are many different processes that are involved in making a transistor that is both manufacturable and realizes the potential of a finFET. For example, there are a number of processes that typically are used in making the required features. For example, there is generally preparation used prior to actually forming a gate dielectric. These preparation steps can have adverse affects on the structures. For example, a clean that is used in preparation for gate dielectric formation has been found to undercut the fin. The clean typically is for removing the same type of material as the underlying insulating layer. Similarly, sidewall spacer formation is more involved than simply applying a conformal layer followed by an anisotropic etch. A protective layer, which is under the sidewall spacer, is typically removed which, when performed, can also etch into an underlying oxide. These are problems that can be more troubling than is immediately apparent. For example, if these etches result in undercutting, the undercut regions can be the location for stringers. These stringers, if bad enough, can actually short elements, such as gates, together. Further, they can degrade performance or leave undesirable materials for the remaining processes.

Accordingly, there is a need for a technique for finFETs that removes or improves upon one or more of the problems described above.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

In one aspect, a fin is formed in a semiconductor layer over an oxide layer. After the fin has been formed, a step of decoupled plasma nitridation (DPN) is performed to form a thin layer of oxynitride on the top surface of the oxide layer. A subsequent clean of the fin uses a material that is much more selective between the semiconductor layer and the layer of oxynitride than between the semiconductor layer and oxide. Thus, the clean does not undercut the fin. A gate dielectric is formed on the fin. A gate is formed over the gate dielectric. A sidewall spacer is formed along the gate. Subsequent processing associated with the sidewall spacer is also prevented from etching into the oxide layer by the oxynitride layer. This is better understood by reference to the drawings and the claims.

Figure 1:
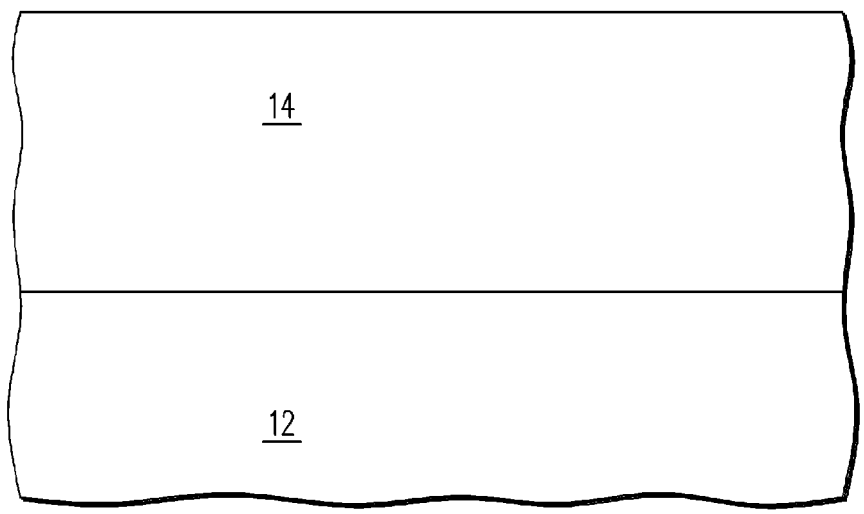
FIG. 1 is a cross section of a semiconductor device at a stage in processing according to an embodiment.

Shown in FIG. 1 is a semiconductor device 10 comprising an oxide layer 12 and a semiconductor layer 14 on oxide layer 12. For structural strength, a thick silicon layer would commonly be under oxide layer 12. The thickness of semiconductor layer may be about 100 nanometers. Semiconductor layer 14 is a material from a fin can be made. Monocrystalline silicon is such an example. A fin, as used herein, is a semiconductor material that has a height above oxide layer 12 greater than its width and is of a material from which a channel of a MOS transistor may be formed. A fin may also be called a vertical semiconductor structure. Oxide layer 12 may also be called a bottom oxide layer (BOX) because it is under semiconductor layer 14.

Figure 2:
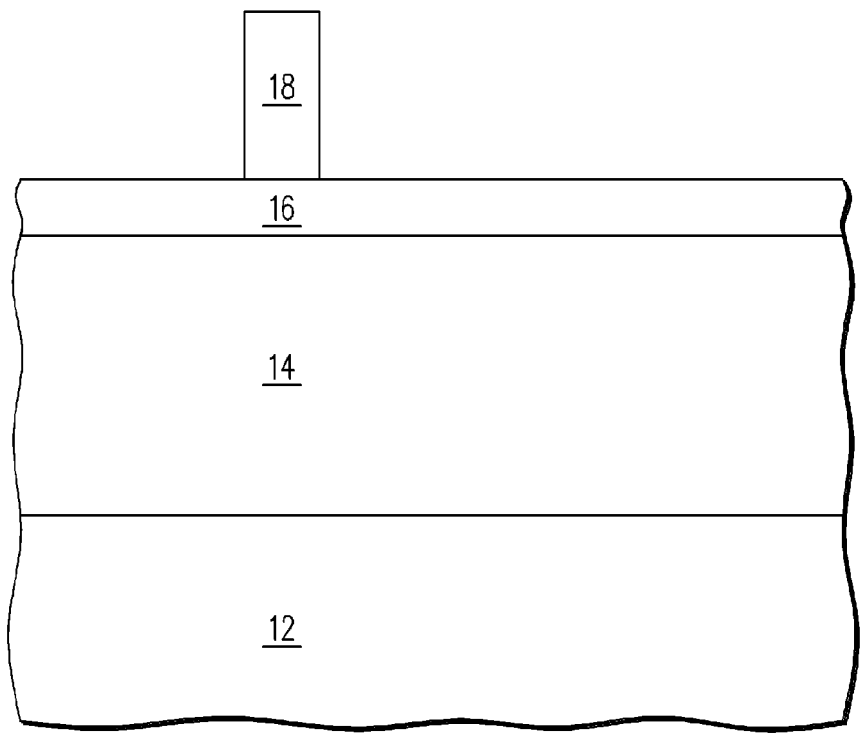
FIG. 2 is a cross section of the semiconductor device of FIG. 1 at a subsequent stage in processing according to an embodiment.

Shown in FIG. 2 is semiconductor device 10 after forming a hard mask layer 16 over semiconductor layer 14 and patterned photoresist 18 over hard mask layer 16. Hard mask layer 16 may be about 25 nanometers thick. Hard mask layer 16 is preferably nitride and may further include a thin oxide layer under the nitride.

Figure 3:
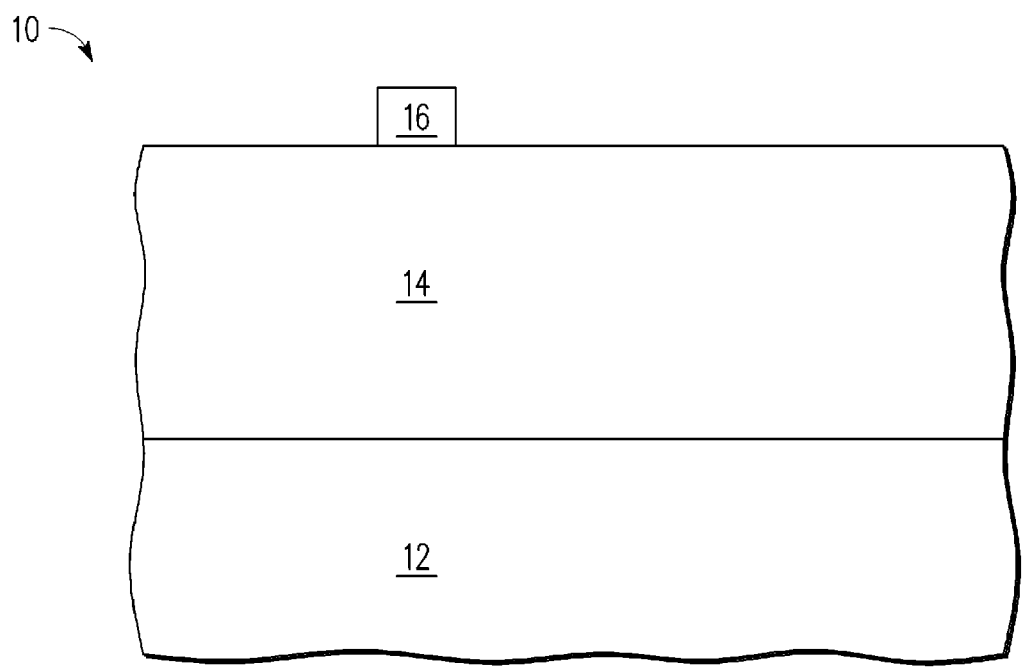
FIG. 3 is a cross section of the semiconductor device of FIG. 2 at a subsequent stage in processing according to an embodiment.

Shown in FIG. 3 is semiconductor device 10 after transferring the pattern of patterned photoresist 18 to hard mask layer 16. This leaves the patterned portion of hard mask layer 16 over semiconductor layer 14. In this example, all of patterned photoresist 18 is removed in the transfer process, but it is also possible there will be some of patterned photoresist 18 remaining at this stage.

Figure 4:
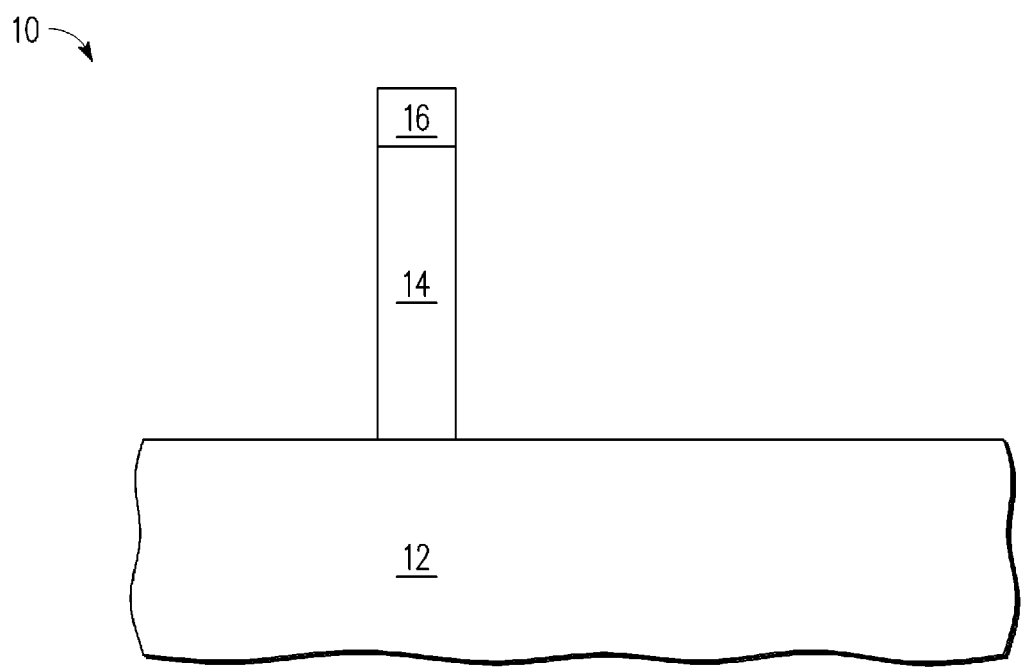
FIG. 4 is a cross section of the semiconductor device of FIG. 3 at a subsequent stage in processing according to an embodiment.

Shown in FIG. 4 is semiconductor device 10 after etching semiconductor layer 14 according to the patterned portion of hard mask layer 16. This etch may be a plasma etch using HBr which is highly selective between silicon and oxide so that the etch can be stopped with the assurance that semiconductor layer 14 is fully patterned as desired while minimal etching of oxide layer 12 has occurred. The result is a fin as the remaining portion of semiconductor layer 14 which may be referenced as fin 14. This etch is also highly selective with nitride so that the patterned portion of hard mask layer 16 remains also.

Figure 5:
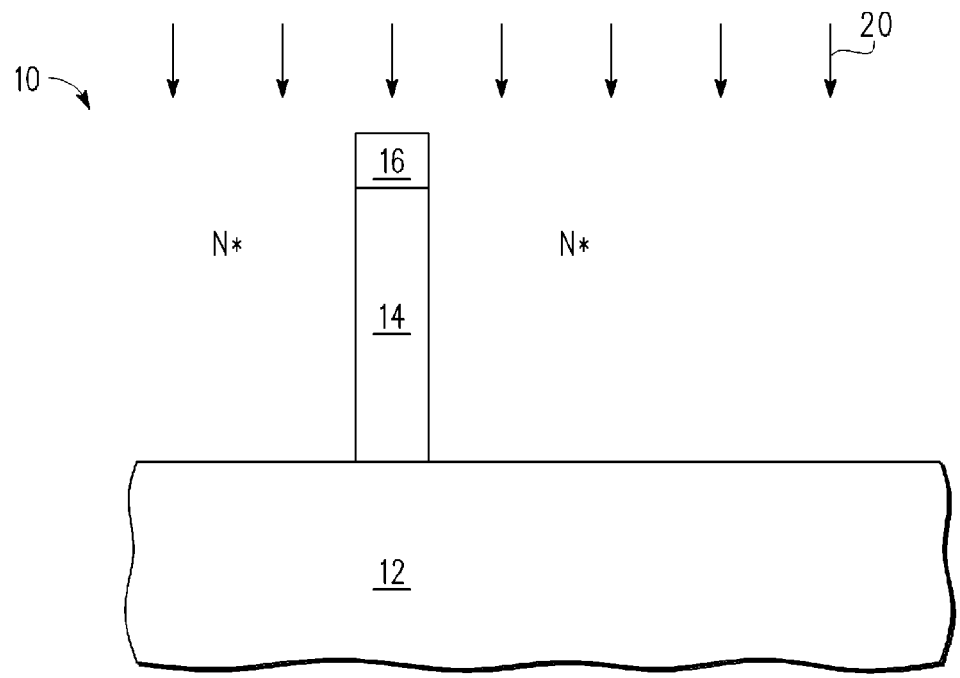
FIG. 5 is a cross section of the semiconductor device of FIG. 4 at a subsequent stage in processing according to an embodiment.

Shown in FIG. 5 is semiconductor device 10 during a decoupled plasma nitridation (DPN) step 20. This is a process which separates nitrogen ($N_2$) into free radicals whereby energetic nitrogen atoms are vertically directed toward the surface of oxide layer 12. There is enough energy to ensure that the nitrogen atoms are applied vertically but low enough energy so the penetration of nitrogen below the surface is kept shallow. With existing equipment for performing DPN, 2000 watts is generally the maximum power and that may be used for it is low enough to avoid very much depth of penetration. The desired depth for peak concentration is about 0.5 nanometer.

Figure 6:
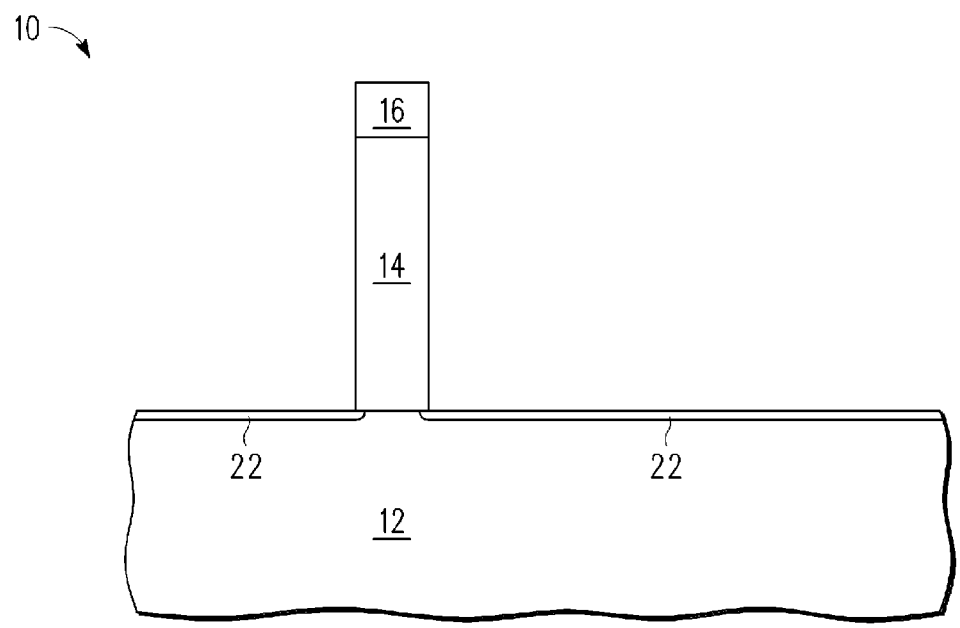
FIG. 6 is a cross section of the semiconductor device of FIG. 5 at a subsequent stage in processing according to an embodiment.

Shown FIG. 6 is semiconductor device 10 after an anneal which converts the combination of oxide and nitrogen to an oxynitride layer 22 along the surface of oxide layer 12 adjacent to fin 14. There is an extension of oxynitride layer 22 under fin 14 of about 1.0 nanometer. Oxynitride layer 22 preferably is nitrogen rich for about the first 0.5 nanometers from the surface and then reduces in nitrogen content. Oxynitride layer 22 preferably becomes oxygen rich at least by 2.0 nanometers below the surface.

Figure 7:
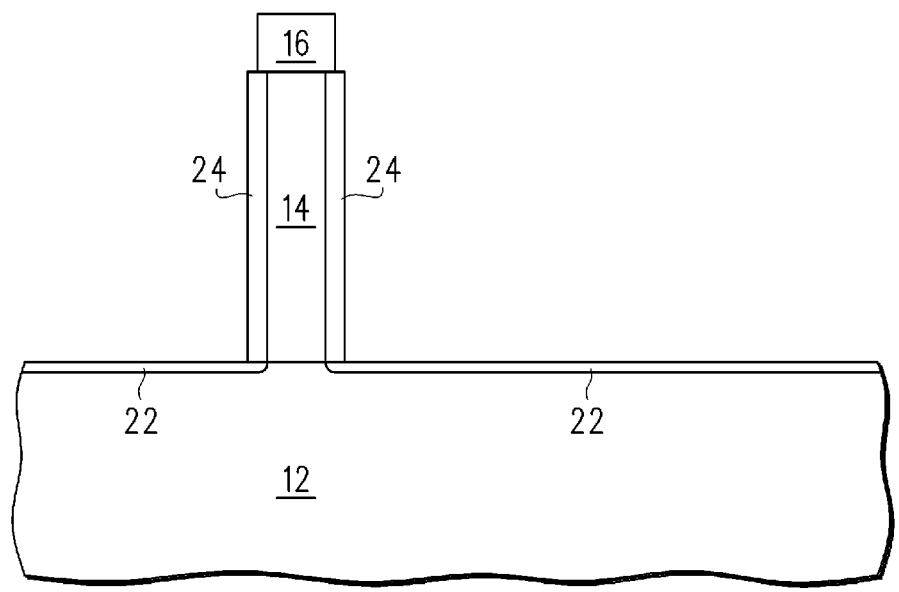
FIG. 7 is a cross section of the semiconductor device of FIG. 6 at a subsequent stage in processing according to an embodiment.

Shown in FIG. 7 is semiconductor device 10 after growing a thin oxide layer 24 that may be about 2.0 nanometers thick around fin 14. This oxide growth neither occurs on oxynitride layer 22 nor hard mask layer 16. Oxide layer 24 is for passivating the damage done to the surface of fin 14 during the etch where semiconductor layer 14 is patterned to form fin 14. The amount of silicon of fin 14 that is consumed in the growth is about 1.0 nanometer. Thus, the result is that the vertical surface of fin 14 is substantially aligned to the edge of oxynitride layer 22.

Figure 8:
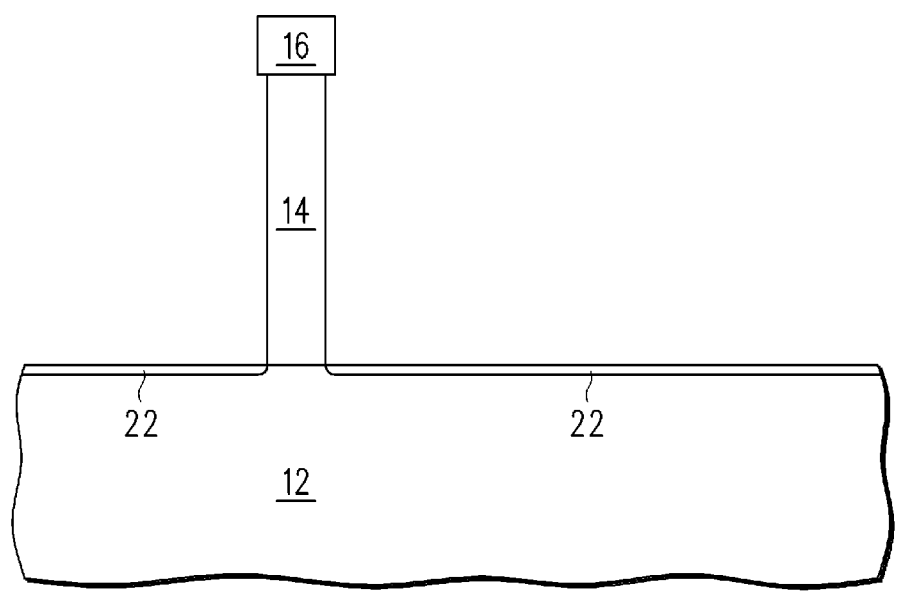
FIG. 8 is a cross section of the semiconductor device of FIG. 7 at a subsequent stage in processing according to an embodiment.

Shown in FIG. 8 semiconductor device 10 after removing oxide layer 24. This is preferably performed with a wet etch such as hydrofluoric acid (HF). This is very effective at removing oxide while causing minimal damage to a silicon surface. The HF also is in contact with oxynitride layer 22. Oxynitride layer 22 protects oxide layer 12 from the HF. Thus the removal of oxide layer 24 does not cause etching into oxide layer 12 and particularly prevents undercutting fin 14. This avoids the possibility of stringers forming in an undercut under fin 14. The removal of oxide layer leaves the sides of fin 14 in an undamaged condition.

Figure 9:
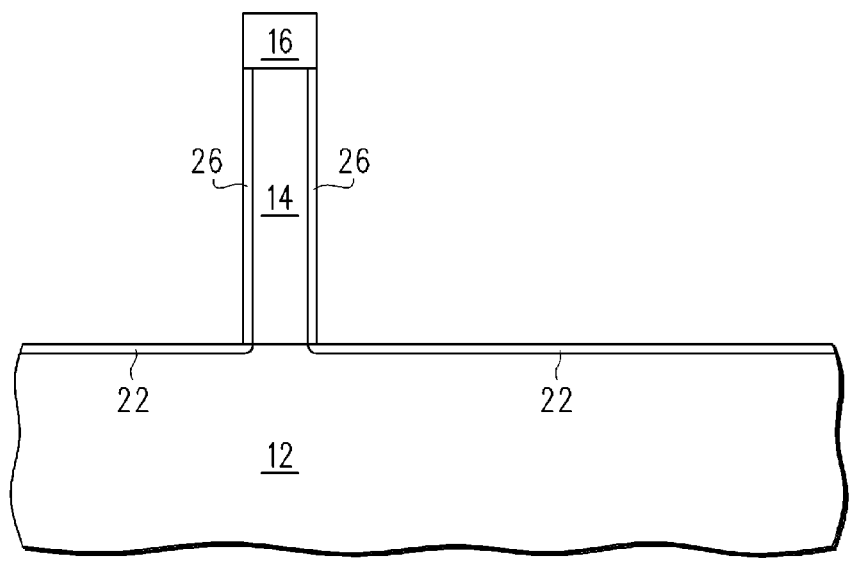
FIG. 9 is a cross section of the semiconductor device of FIG. 8 at a subsequent stage in processing according to an embodiment.

Shown in FIG. 9 is semiconductor device 10 after forming a gate dielectric 26 on the sides of fin 14. Gate dielectric 26 may be an oxide grown at a relatively high temperature. With the sides of fin 14 being undamaged, gate dielectric 26 can be grown with high quality and may be quite thin. In this example, gate dielectric 26 may be 2.0 nanometers. As an alternative, gate dielectric 26 may be a high K dielectric and would be deposited. Even if gate dielectric 26 is a high K material, it is still beneficial for the sides of fin 14 to be as undamaged as possible.

Figure 10:
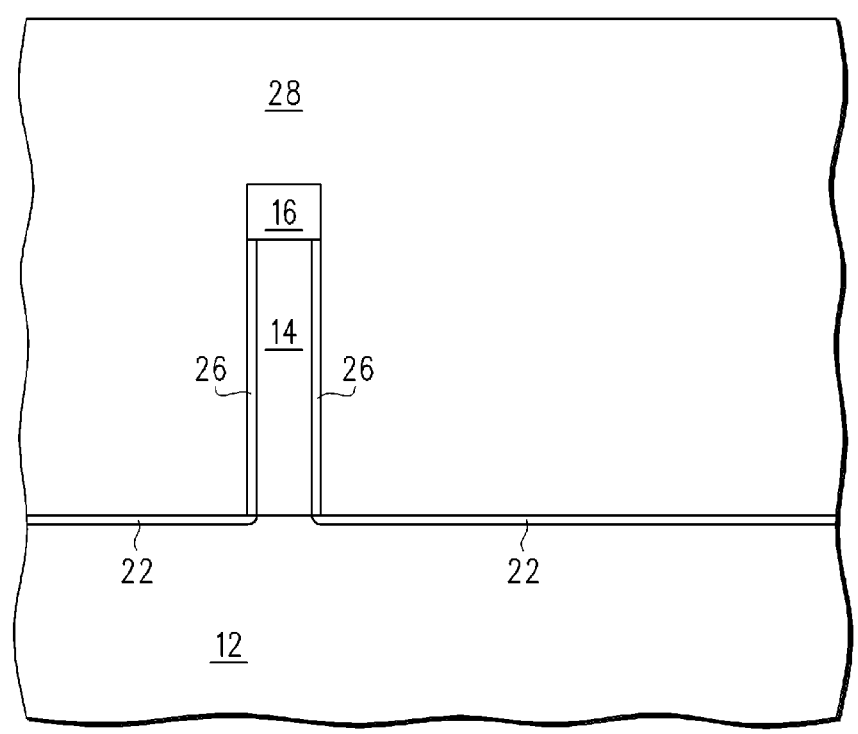
FIG. 10 is a cross section of the semiconductor device of FIG. 9 at a subsequent stage in processing according to an embodiment.

Shown in FIG. 10 is semiconductor device 10 after forming a gate material 28 over fin 14. Gate material 28 may be polysilicon and formed by a deposition followed by a step of chemical mechanical polishing (CMP). Gate material 28 may instead be a metal or a combination of conductive materials.

Figure 11:
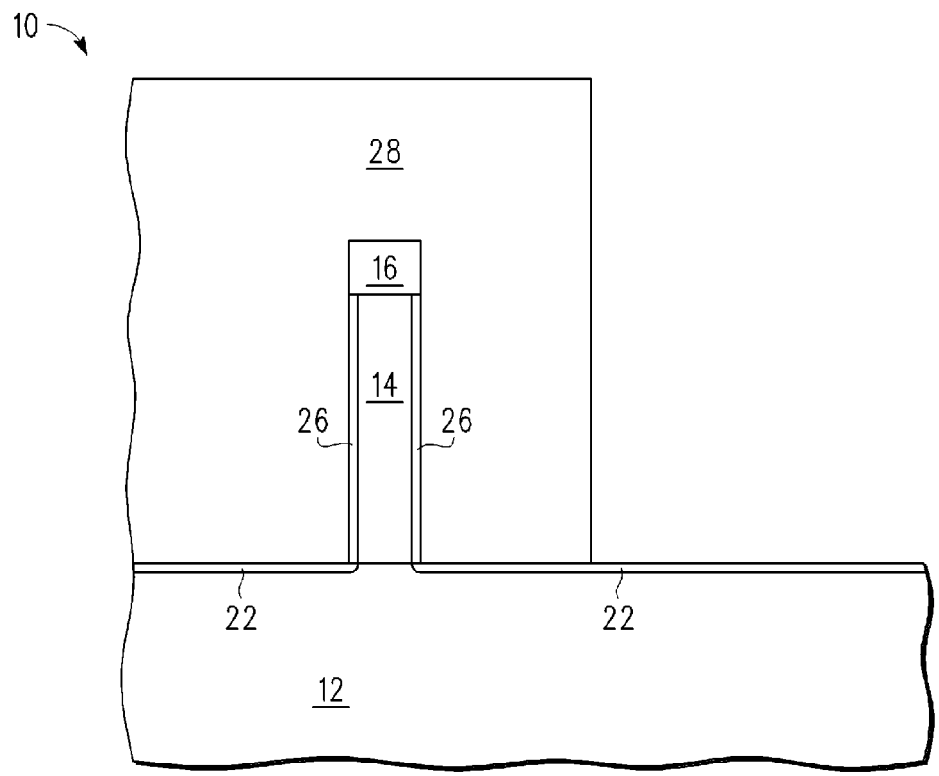
FIG. 11 is a cross section of the semiconductor device of FIG. 10 at a subsequent stage in processing according to an embodiment.

Shown in FIG. 11 is semiconductor device 10 after patterning gate material 28 to form a gate. The patterning as shown in FIG. 11 shows a side of a gate that is an end point of the gate formed from patterning gate material 28.

Figure 12:
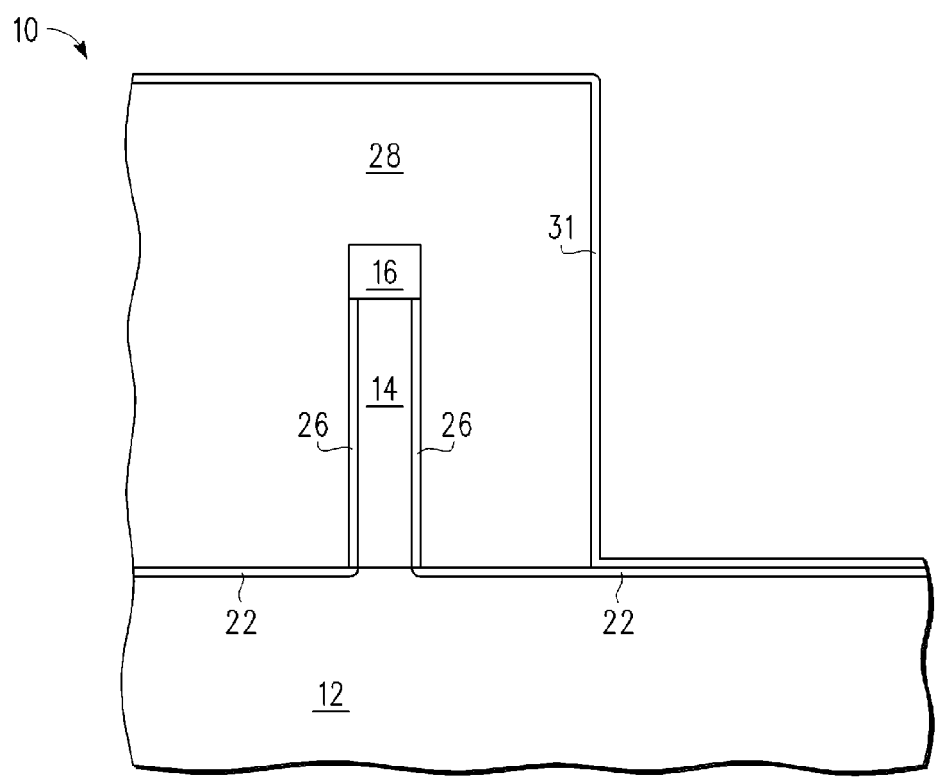
FIG. 12 is a cross section of the semiconductor device of FIG. 11 at a subsequent stage in processing according to an embodiment.

Shown in FIG. 12 is semiconductor device 10 after forming a protective layer 31 around gate material 28, including the side of the gate. Protective layer 31 may be a deposited oxide so it extends over oxynitride layer 22 adjacent to the side of the gate. Protective layer 31 may be oxide of about 5.0 nanometers in thickness.

Figure 13:
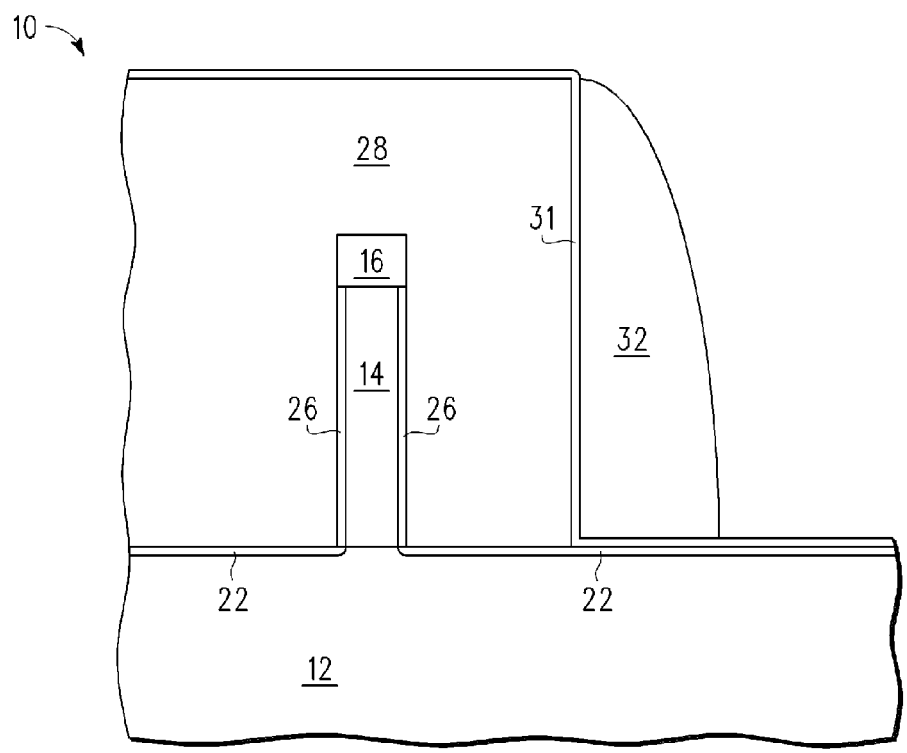
FIG. 13 is a cross section of the semiconductor device of FIG. 12 at a subsequent stage in processing according to an embodiment.

Shown in FIG. 13 is semiconductor device 10 after forming a sidewall spacer 32 along the side of the gate. Sidewall spacer 32 may be nitride. Sidewall spacer 32 is useful in providing a mask for source/drain formation.

Figure 14:
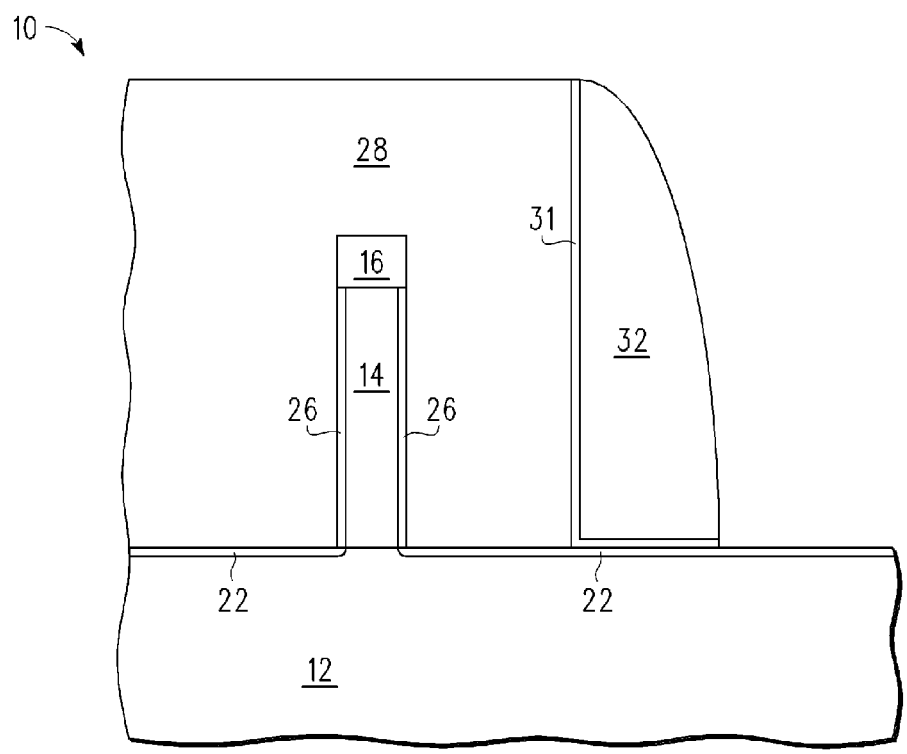
FIG. 14 is a cross section of the semiconductor device of FIG. 13 at a subsequent stage in processing according to an embodiment.

Shown in FIG. 14 is semiconductor device 10 after removing protective layer 31 adjacent to the sidewall spacer 32. Protective layer 31, at the time of deposition is formed over areas that may require subsequent silicidation. In such case it is preferable that protective layer 31 be removed from those areas to be silicided without requiring a mask. Without using a mask, exposed protective layer 31 adjacent to sidewall spacer 32 is removed. In the case of protective layer 31 being an oxide, which is the typical case, oxynitride layer 22 protects oxide layer 12 from being etched during the removal of the exposed portion of protective layer 31. Although likely to be less of a problem than undercutting fin 14, it is still preferable that oxide layer 12 not be etched during the removal of the exposed portion of protective layer 31.

Oxynitride layer 22 is thus useful for protecting oxide layer 14 from both the preparation for the gate dielectric formation and the removal of protective layer 31.

By now it should be appreciated that there has been provided a method for processing a substrate having at least a buried oxide (BOX) layer and a semiconductor material layer. The method includes etching the semiconductor material layer to form a vertical semiconductor material structure overlying the BOX layer, leaving an exposed portion of the BOX layer. The method further includes exposing a top surface of the exposed portion of the BOX layer to an oxide etch resistant species to form a thin oxide etch resistant layer overlying the exposed portion of the BOX layer. The method may further include forming a hard mask layer overlying the semiconductor material layer, forming a patterned photo resist layer overlying the hard mask layer, and using the patterned photo resist layer etching the hard mask layer to form a hard mask. The method may be further characterized by the etching the semiconductor material layer comprising using the hard mask to form the vertical semiconductor material structure overlying the BOX layer. The method may be further characterized by the vertical semiconductor material structure being a fin structure corresponding to a FinFET transistor. The method may be further characterized by the oxide etch resistant layer including Nitrogen. The method may be further characterized by the exposing step including exposing the exposed portion of the BOX layer to Nitrogen in a radio frequency plasma chamber. The method may be further characterized by the exposing step including using a decoupled plasma nitridation (DPN) process to expose the exposed portion of the BOX layer to Nitrogen. The method may further include forming a sacrificial oxide layer on at least an exposed surface of the vertical semiconductor material structure and performing a hydro-fluoride (HF) clean to substantially remove the sacrificial oxide layer, wherein the thin oxide etch resistant layer protects the exposed portion of the BOX layer from the HF clean. The method may be further characterized by the exposing step being performed in a manner such that the thin oxide etch resistant layer has a thickness of less than 20 nanometers. The method may be further characterized by the exposing step being performed in a manner such that the thin oxide etch resistant layer has a Nitrogen concentration profile such that a top portion of the thin oxide etch resistant layer has a significantly higher concentration of Nitrogen than a bottom portion of the thin oxide etch resistant layer. The method may be further characterized by the exposing step being performed in a manner such that the thin oxide etch resistant layer has sufficient thickness to protect the underlying BOX layer from erosion caused by a subsequent wet cleaning steps.

Also described is a method for processing a substrate having at least a buried oxide (BOX) layer and a semiconductor material layer. The method includes forming a hard mask layer overlying the semiconductor material layer. The method further includes forming a patterned photo resist layer overlying the hard mask layer. The method further includes using the patterned photo resist layer, etching the hard mask layer to form a hard mask. The method further includes etching the semiconductor material layer, except for a portion of the semiconductor material layer underlying the hard mask to form a vertical semiconductor material structure overlying the BOX layer, leaving an exposed portion of the BOX layer. The method further includes exposing a top surface of the exposed portion of the BOX layer to Nitrogen to form a thin oxide etch resistant layer overlying the exposed portion of the BOX layer. The method further includes forming a sacrificial oxide layer on at least an exposed surface of the vertical semiconductor material structure. The method further includes performing a hydro-fluoride (HF) clean to substantially remove the sacrificial oxide layer, wherein the thin oxide etch resistant layer protects the exposed portion of the BOX layer from the HF clean. The method may be further characterized by the vertical semiconductor material structure being a fin structure corresponding to a FinFET transistor. The method may be further characterized by the exposing step including exposing the exposed portion of the BOX layer to Nitrogen in a radio frequency plasma chamber. The method may be further characterized by the exposing step including using a decoupled plasma nitridation (DPN) process to expose the exposed portion of the BOX layer to Nitrogen. The method may be further characterized by the exposing step being performed in a manner such that the thin oxide etch resistant layer has a thickness of less than 20 nanometers. The method may be further characterized by the exposing step being performed in a manner such that the thin oxide etch resistant layer has a Nitrogen density concentration such that a top portion of the thin oxide etch resistant layer has a significantly higher concentration of Nitrogen than a bottom portion of the thin oxide etch resistant layer. The method may be further characterized by the exposing step being performed in a manner such that the thin oxide etch resistant layer has sufficient thickness to protect the underlying BOX layer from erosion caused by a subsequent wet cleaning steps.

Disclosed also is a semiconductor device formed using a wafer having a buried oxide (BOX) layer and a semiconductor material layer. The semiconductor device includes a vertical semiconductor material structure formed overlying the BOX layer. The semiconductor device further includes a thin oxide etch resistant layer formed over an exposed portion of the BOX layer, wherein the thin oxide etch resistant layer is formed to protect a portion of the BOX layer substantially underlying the vertical semiconductor material structure. The semiconductor device may further include a gate dielectric layer formed around at least a portion of the vertical semiconductor material structure, a gate material structure formed around at least a portion of the gate dielectric layer, a liner formed adjacent the gate material structure, wherein the liner is formed overlying an exposed portion of the thin oxide etch resistant layer, and a spacer formed adjacent the liner.

Moreover, the terms "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Although the invention is described herein with reference to specific embodiments, various modifications and changes can be made without departing from the scope of the present invention as set forth in the claims below. For example, the gate is shown as being over hard mask layer 16, but hard mask layer 16 could be removed at a time prior to forming the gate dielectric. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method for processing a substrate comprising at least a buried oxide (BOX) layer and a semiconductor material layer, the method comprising:
    etching the semiconductor material layer to form a vertical semiconductor material structure overlying the BOX layer in a manner that avoids undercutting the vertical semiconductor material structure, leaving an exposed portion of the BOX layer;
    prior to applying an etchant to the BOX layer that is capable of etching the BOX after the step of etching, exposing a top surface of the exposed portion of the BOX layer to an oxide etch resistant species to form a thin oxide etch resistant layer overlying the exposed portion of the BOX layer; and
    thinning the vertical semiconductor material structure to form a thinned vertical structure so that the thin oxide etch resistant layer is adjacent to but not under any portion of the thinned vertical structure.

2. The method of claim 1 further comprising:
    forming a hard mask layer overlying the semiconductor material layer;
    forming a patterned photo resist layer overlying the hard mask layer; and
    using the patterned photo resist layer etching the hard mask layer to form a hard mask.

3. The method of claim 2, wherein etching the semiconductor material layer comprises using the hard mask to form the vertical semiconductor material structure overlying the BOX layer.

4. The method of claim 1, wherein the step of etching comprising applying HBr.

5. The method of claim 1, wherein the oxide etch resistant layer includes Nitrogen.

6. The method of claim 1, wherein the exposing step includes exposing the exposed portion of the BOX layer to Nitrogen in a radio frequency plasma chamber.

7. The method of claim 1, wherein the exposing step includes using a decoupled plasma nitridation (DPN) process to expose the exposed portion of the BOX layer to Nitrogen.

8. The method of claim 1 wherein the step of thinning comprises:
   after the step of exposing, growing a sacrificial oxide layer on at least an exposed surface of the vertical semiconductor material structure; and
   performing a hydro-fluoride (HF) clean to substantially remove the sacrificial oxide layer, wherein the thin oxide etch resistant layer protects the exposed portion of the BOX layer from the HF clean.

9. The method of claim 1, wherein the exposing step is performed in a manner such that the thin oxide etch resistant layer has a thickness of less than 20 nanometers.

10. The method of claim 9, wherein the exposing step is performed in a manner such that the thin oxide etch resistant layer has a Nitrogen concentration profile such that a top portion of the thin oxide etch resistant layer has a significantly higher concentration of Nitrogen than a bottom portion of the thin oxide etch resistant layer.

11. The method of claim 1, wherein the exposing step is performed in a manner such that the thin oxide etch resistant layer has sufficient thickness to protect the underlying BOX layer from erosion caused by a subsequent wet cleaning steps.

12. A method for processing a substrate comprising at least a buried oxide (BOX) layer and a semiconductor material layer, the method comprising:
   forming a hard mask layer overlying the semiconductor material layer;
   forming a patterned photo resist layer overlying the hard mask layer;
   using the patterned photo resist layer, etching the hard mask layer to form a hard mask;
   etching the semiconductor material layer using HBr, except for a portion of the semiconductor material layer underlying the hard mask to form a vertical semiconductor material structure overlying the BOX layer, leaving an exposed portion of the BOX layer;
   prior to applying an etchant to the BOX that is capable of etching the BOX after the step of etching, exposing a top surface of the exposed portion of the BOX layer to Nitrogen to form a thin oxide etch resistant layer overlying the exposed portion of the BOX layer;
   growing a sacrificial oxide layer on at least an exposed surface of the vertical semiconductor material structure; and
   performing a hydro-fluoride (HF) clean to substantially remove the sacrificial oxide layer to form a thinned vertical structure, wherein the thin oxide etch resistant layer protects the exposed portion of the BOX layer from the HF clean and so that the thin oxide resistant layer is adjacent to but not under any portion of the thinned vertical structure.

13. The method of claim 12, wherein the vertical semiconductor material structure is a fin structure corresponding to a FinFET transistor.

14. The method of claim 12, wherein the exposing step includes exposing the exposed portion of the BOX layer to Nitrogen in a radio frequency plasma chamber.

15. The method of claim 12, wherein the exposing step includes using a decoupled plasma nitridation (DPN) process to expose the exposed portion of the BOX layer to Nitrogen.

16. The method of claim 12, wherein the exposing step is performed in a manner such that the thin oxide etch resistant layer has a thickness of less than 20 nanometers.

17. The method of claim 16, wherein the exposing step is performed in a manner such that the thin oxide etch resistant layer has a Nitrogen density concentration such that a top portion of the thin oxide etch resistant layer has a significantly higher concentration of Nitrogen than a bottom portion of the thin oxide etch resistant layer.

18. The method of claim 12, wherein the exposing step is performed in a manner such that the thin oxide etch resistant layer has sufficient thickness to protect the underlying BOX layer from erosion caused by a subsequent wet cleaning steps.

19. A semiconductor device formed using a wafer comprising a buried oxide (BOX) layer and a semiconductor material layer, the semiconductor device comprising:
   a vertical semiconductor material structure formed overlying the BOX layer; and
   a thin oxide etch resistant nitride layer formed over an exposed portion of the BOX layer, wherein the thin oxide etch resistant nitride layer is formed to protect a portion of the BOX layer substantially underlying the vertical semiconductor material structure and is adjacent to but not under any portion of the vertical semiconductor material structure.

20. The semiconductor device of claim 19, further comprising:
   a gate dielectric layer formed around at least a portion of the vertical semiconductor material structure;
   a gate material structure formed around at least a portion of the gate dielectric layer;
   a liner formed adjacent the gate material structure, wherein the liner is formed overlying an exposed portion of the thin oxide etch resistant layer; and
   a spacer formed adjacent the liner.

* * * * *